(12) United States Patent
Sessink

(10) Patent No.: US 6,456,833 B1
(45) Date of Patent: Sep. 24, 2002

(54) METHOD FOR NOISE REDUCTION IN THE RECEPTION OF RF FM SIGNALS

(75) Inventor: Franciscus Josephus A. M. Sessink, Nuenen (NL)

(73) Assignee: Siemens VDO Automotive AG (DE)

( * ) Notice: Subject to any disclaimer, the term of this patent is extended or adjusted under 35 U.S.C. 154(b) by 0 days.

(21) Appl. No.: 09/450,624

(22) Filed: Nov. 30, 1999

(30) Foreign Application Priority Data

Nov. 30, 1998 (EP) .............................................. 98204040

(51) Int. Cl.$^7$ .................................................. H04B 1/10

(52) U.S. Cl. ........................................ 455/212; 455/218

(58) Field of Search .................................. 455/212, 213, 455/218–224; 381/13

(56) References Cited

U.S. PATENT DOCUMENTS

| 4,607,392 A | * | 8/1986 | Nolde et al. ................. 455/192 |
| 4,914,715 A | | 4/1990 | Miyata |
| 5,036,542 A | | 7/1991 | Ueno |

* cited by examiner

*Primary Examiner*—Lee Nguyen
(74) *Attorney, Agent, or Firm*—Mayer, Brown, Rowe, & Maw

(57) ABSTRACT

A method for noise reduction during FM reception and a receiver executing the method. A detected audiosignal is being attenuated. A field strength indicative muting control signal is derived from an IF signal which is used to control an attenuation of the audiosignal, when the field strength decreases below a certain threshold level. To prevent false mute responses from distorting the audiosignal, a time constant in the mute control signal is increased with an increasing deviation of the momentary frequency of the received FM signal from the FM carrier frequency and vice versa.

8 Claims, 3 Drawing Sheets

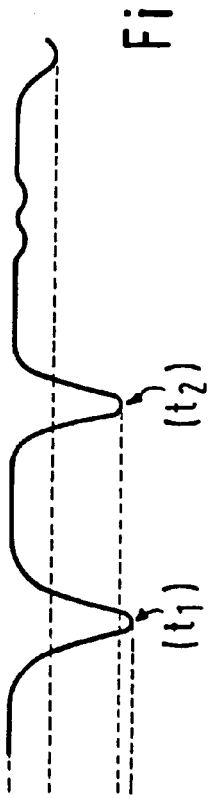
Fig. 2c
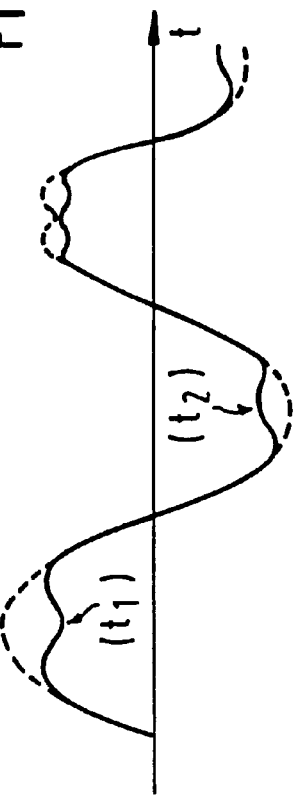
Fig. 2d
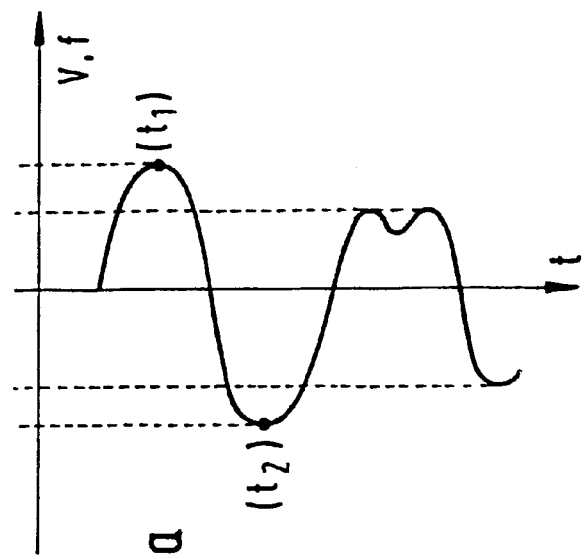
Fig. 2b
Fig. 2a

METHOD FOR NOISE REDUCTION IN THE RECEPTION OF RF FM SIGNALS

FIELD OF INVENTION

The present invention relates to a method for noise reduction during FM reception by attenuating a detected audiosignal, a field strength indicative muting control signal being derived from an IF signal which is used to control an attenuation of the audiosignal, when the field strength decreases below a certain threshold level and a receiver for executing the method.

BACKGROUND OF THE INVENTION

A receiver executing a noise reduction method is known e.g. from U.S. Pat. No. 5,410,751 and has an RF front end for tuning the receiver onto a wanted RF FM signal. The RF front end demodulates the received RF FM signal into an IF signal. The RF front end is subsequently coupled to a selective IF amplifier for selecting and amplifying the IF signal and an FM detector for detecting the IF signal to obtain its baseband FM modulation signal, which is an audiosignal. The baseband FM modulation signal is supplied to a muting circuit. The muting circuit suppresses FM demodulation noise under control of the field strength indicative muting control signal. The FM demodulation noise is indicated as FM interstation noise and occurs at the output of the FM detector. The muting control signal is derived from the IF signal by measuring the level thereof in an IF level detector coupled to the IF amplifier and filtered and/or smoothed in a lowpass filter following the IF level detector.

FM noise occurring in the baseband FM modulation signal at the output of the FM detector and also in the audio signals derived from the detector, increases inversely to the field strength of the received FM RF signal. In particular FM RF signals decreasing below a certain threshold value give rise to a sharp increase in FM noise. In the known receiver, this FM noise is suppressed by an attenuation or mute of the baseband FM modulation signal in the muting circuit every time the lowpass filtered IF signal level drops below a certain threshold value. However, the IF signal level is not always related one to one to the field strength of the received RF FM signal. Due to the passband frequency characteristic of the IF selectivity, the IF signal level not only varies with the field strength of the received RF FM signal, but also with the deviation of the momentary frequency of the IF FM signal from the IF carrier frequency. Depending on the magnitude of deviation, filter side suppression may occur, reducing the IF signal level considerably. This may occur in the absence of FM noise and even when receiving undisturbed RF FM signals of moderate strength. Such frequency deviation dependent reductions in the IF signal level, in particular when occurring with FM RF signals received with low field strength, may give rise to unwanted mute actions and signal attenuations, resulting in distortions of the useful audiosignal.

In the known receiver the lowpass filter following the IF level detector at the output of the IF amplifier smooths the muting behavior and introduces a time constant in the mute control, thereby delaying the mute control to some extent. The choice of this time constant is critical with regard to the balance between signal distortion on the one hand and audible FM noise on the other hand. The lower the cutoff frequency of the lowpass filter, the larger the time constant and delay in the mute control, the less mute actions and the less distortions will occur, but this also results in the less alert FM noise being suppressed thereby causing FM noise to be increasingly audible, and vice versa.

Thus there is a need to introduce an additional degree of freedom in the mute control providing a solution to the above conflicting requirements to the time constant of the mute control.

SUMMARY OF THE INVENTION

A method of field strength dependent noise reduction during FM reception as mentioned here above according to the invention is therefore characterized by a time constant in the mute control being increased with an increasing deviation of the momentary frequency of the received FM signal from the FM carrier frequency and vice versa.

The method according to the invention differentiates in its mute responsiveness to reductions in the IF signal level at the output of the IF selectivity between reductions due to filter side suppression and those due to decreasing field strength. It is based on the recognition that IF signal level reductions due to filterside suppressions are mainly caused by undisturbed, low modulation frequencies and do not need to effect any muting. IF signal level reductions caused otherwise result mainly from decreasing field strength giving rise to audible FM noise, which need to be muted.

By applying this measure according to the invention, the time constant of the lowpass filter is decreased to a small value, thereby making the mute control highly responsive to IF level reductions, when the modulation frequency is varying within the pass band of the IF selectivity. This results in an alert and adequate muting of FM noise. In the following muting is to be understood as any decrease in signal gain or increase in signal attenuation, be it stepwise or gradual. The time constant of the lowpass filter and that of the mute control is considerably increased when the momentary frequency of the IF signal deviates from the carrier frequency to such extent that due to filter side suppression the IF signal level is noticeably reduced. This prevents unnecessary mute actions and distortions of the useful audio signals from occurring.

Preferably a time constant control signal reflecting the deviation of the momentary frequency of the IF signal from the IF carrier frequency is derived from the level of detected baseband FM modulation signal being obtained by means of a rectifier having lowpass filter functionality for rectifying and selecting the detected baseband FM modulation signal being supplied from the output of the FM detector to the rectifier.

In another preferred embodiment of the invention, a non-linear amplifier is used to amplify the time constant control signal with a non-linear gain allowing more accurate adjustment of the time constant variation of the mute control to the occurrence of FM noise as a function of the deviation of the momentary frequency of the IF signal from the IF carrier frequency.

In yet another preferred embodiment of such a receiver using analog circuitry the FM modulation signal level detector is subsequently coupled between the output of the FM detector and the time constant control terminal of the lowpass filter, a DC blocking filter and the rectifier. The DC blocking filter eliminates any DC component in the baseband FM modulation signal which may result e.g. from tolerance differences in the circuitry elements of in particular the IF amplifier. In the receiver shown, the rectifier is provided with a post detection lowpass filter with averaging function.

It is to be understood that both the foregoing general description and the following detailed description are not limiting but are intended to provide further explanation of the invention claimed. The accompanying drawings, which are incorporated in and constitute part of this specification, are included to illustrate and provide a further understanding of the method and system of the invention. Together with the description, the drawings serve to explain the principles of the invention.

BRIEF DESCRIPTION OF THE DRAWINGS

The invention permits numerous embodiments. In order to illustrate its basic principle, these embodiments are described hereinbelow and are illustrated in the drawing, in which:

FIGS. 2a–2d show a muting operation affecting the audio signal, according to a prior art FM receiver with selective IF amplifier side, in which:

FIG. 2a shows an example of a time dependent variation of the momentary IF modulation frequency;

FIG. 2b shows an IF filter response;

FIG. 2c shows the time dependent signal level variation at the output of the IF filter;

FIG. 2d shows the deteriorating effect of the muting operation on the audiosignal.

FIGS. 3a–3f show the mute response of the FM receiver in FIG. 1 according to the present invention, in which:

FIG. 3a shows a time dependent amplitude variation of the detected baseband FM modulation signal, or audiosignal with a DC component;

FIG. 3b shows the signal of FIG. 3a without the DC component;

FIG. 3c shows the signal of FIG. 3b after being rectified;

FIG. 3d shows the signal of FIG. 3c after being non-linearly amplified, which signal is being used as a time constant control signal;

FIG. 3e shows the time dependent IF level signal;

FIG. 3f shows the time dependent undistorted audio signal.

DETAILED DESCRIPTION OF THE PREFERRED EMBODIMENT

Figure 1:
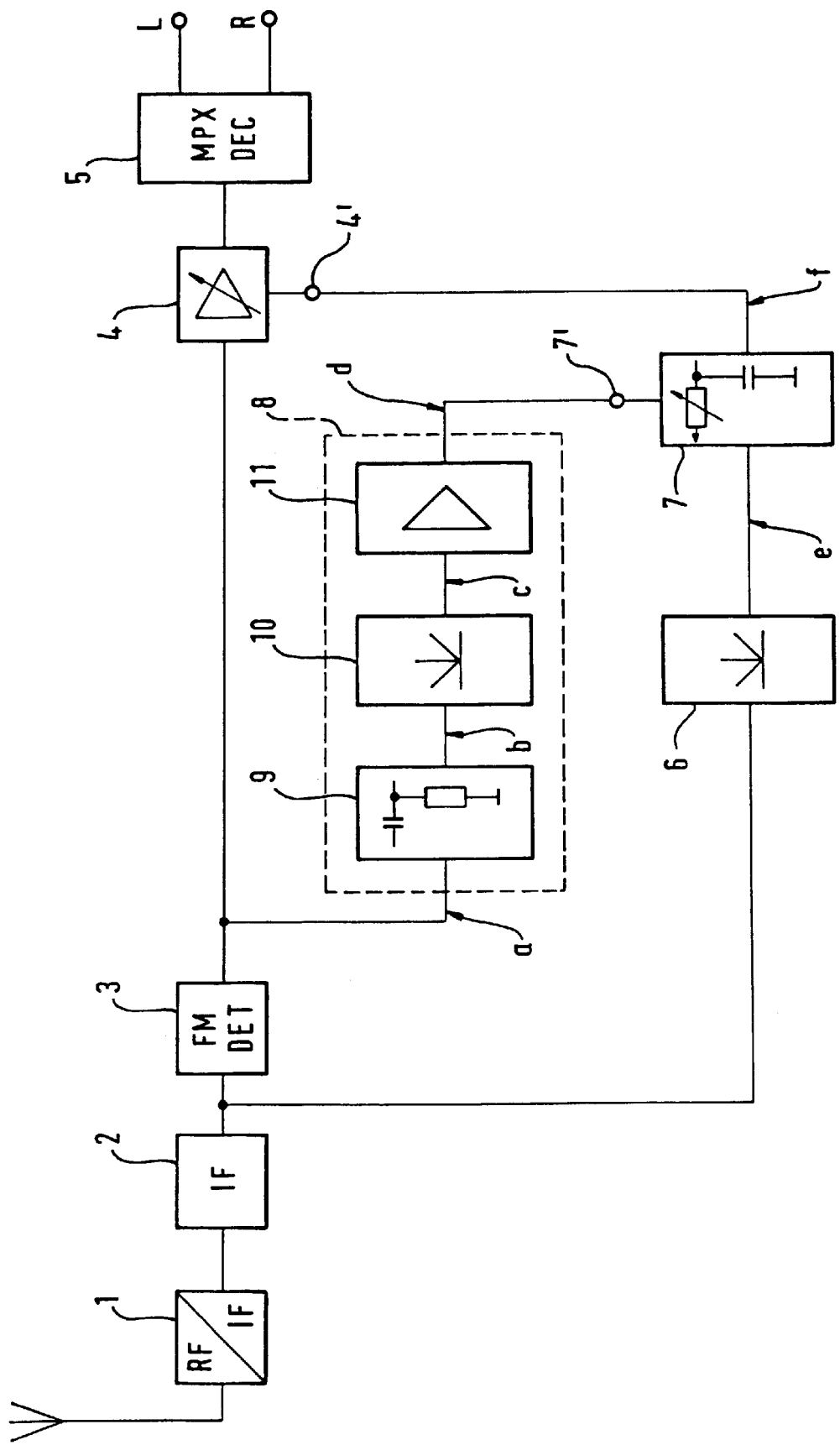
FIG. 1 shows an FM receiver executing the method according to the invention.

While the present invention is capable of embodiment in various forms, there is shown in the drawings and will hereinafter be described a presently preferred embodiment with the understanding that the present disclosure is to be considered as an exemplification of the invention, and is not intended to limit the invention to the specific embodiment illustrated.

FIG. 1 shows an FM receiver for executing the method according to the present invention. The FM receiver has an RF front end I to tune the receiver onto a wanted RF FM signal and to demodulate the same into an IF FM signal. The RF front end 1 is coupled to a selective IF amplifier 2 to select and amplify the IF FM signal and an FM detector 3 for detecting the baseband FM modulation signal from the IF FM signal. The IF FM signal may be a FM stereomultiplex signal. A muting circuit 4 attenuates the baseband FM modulation signal at the occurrence of FM demodulation noise at the output of the IF amplifier 2. A demultiplexer 5 demultiplexes the eventual stereomultiplex signal from the baseband FM modulation signal at the output of the FM detector 3 into left and right stereosignals. The stereosignals may be made available for reproduction into loudspeakers (not shown) at left and right sterosignal terminals L and R. The demultiplexer 5 can be eliminated in case the FM receiver is to process monosignals only. The muting circuit 4 may be formed by a variable amplifier or attenuator, for example, and is provided with a mute control terminal 4' for supplying a mute control signal to vary the attenuation or gain of the muting circuit 4.

The mute control signal is derived from the filtered IF signal at the output of the IF amplifier 2 by means of an IF level detector 6 followed by a variable first lowpass filter 7. The IF level detector 6 detects the level of the IF signal at the output of the selective IF amplifier 2, which is then filtered in the variable lowpass filter 7. This variable lowpass filter 7 includes a lowpass RC filter element having a time constant and a signal includes delay circuit having a serial resistor and a mass connected capacitor. The resistor is varied by means of a time constant control signal supplied to a time constant control terminal 7' of the variable lowpass filter 7. An output of the lowpass filter 7 is coupled to a mute control terminal 4' of the muting circuit 4. Any decrease of the IF signal level below a certain threshold value will effect an attenuation of the baseband FM modulation signal in the muting circuit 4 resulting in the reproduced audiosignal being muted. The time constant of the mute control is determined by the time constant of the variable lowpass filter 7.

The description of the receiver according to the invention, given so far, also reads on the receiver known from the above cited U.S. Pat. No. 5,410,751 with the exception that the lowpass filter 7 therein is not variable, i.e. the time constant thereof is chosen at a fixed value.

The problems occurring in this known receiver, for which the invention provides a solution, are explained with reference to FIG. 2.

FIGS. 2a–c shows how IF FM signals carrying a modulation signal with deviations of the momentary frequency of the IF signal from the IF carrier frequency at t1 and t2 (see FIG. 2a), which are large enough to cross the filter slope frequency areas (see FIG. 2b), result in a periodical decrease of the IF signal level at the input of the lowpass filter 7 (FIG. 2c). For modulation frequencies of the IF modulation signal above the cut-off frequency of the lowpass filter 7, these periodical decreases will be blocked by the lowpass filter 7, thereby preventing the muting circuit 4 to attenuate or mute the baseband FM modulation signal and/or the audio signal included therein. However, for modulation frequencies of the IF modulation signal below the cut-off frequency of the lowpass filter 7, these periodical decreases will be smoothed and passed through to the mute control terminal 4' of the muting circuit 4, thereby effecting an attenuation or mute of the baseband FM modulation signal and/or the audio signal included therein. This results in signal distortions at t1 and t2 as shown in FIG. 2d.

Lowering the time constant of the lowpass filter 7 would prevent such distortions from occurring, however, at the same time would delay the mute control to such extent that mute actions are avoided also at the occurrence of audible FM noise. This would deteriorate the overall noise performance of the receiver.

According to the invention, the time constant in the mute control signal of the receiver of FIG. 1 is controlled with a time constant control signal derived from the detected baseband FM modulation signal. For this, the receiver has a baseband FM modulation signal level detector 8 coupled between an output of the FM detector 3 and the time constant control terminal 7' of the variable first lowpass filter 7 for varying the time constant of the lowpass filter 7 depending on the level of the baseband FM modulation signal. In the receiver shown in FIG. 1, the baseband FM modulation signal level detector 8 is subsequently coupled to the output of the FM detector 3. The detector 8 also has a DC blocking filter 9, a rectifier 10 and a non-linear amplifier 11. The blocking filter 9 blocks DC components in the baseband FM modulation signal at the output of the detector 3. The rectifier 10 has lowpass filter functionality to rectify, select and/or smooth the baseband FM modulation signal, therewith obtaining a signal, reflecting the deviation of the momentary frequency of the IF signal from the IF carrier frequency. The non-linear amplifier 11 allows more accurate adjustment of the time constant variation of the mute control to the occurrence of FM noise as a function of the deviation of the momentary frequency of the IF signal from the IF carrier frequency.

FIGS. 3 a–f show in more detail the effect of the measures according to the invention on the muting response of the receiver of FIG. 1.

Figure 3A:
Figure 3B:
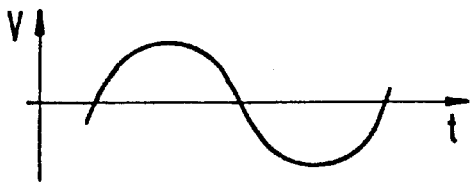

FIG. 3a shows an amplitude variation of the detected baseband FM modulation signal, or audiosignal a as the case may be, at the output of the FM detector 3 in FIG. 1. The amplitude variation signal a reflects the variation of the momentary frequency of the IF signal from the IF carrier frequency and is supplied to the DC blocking filter 9. The DC blocking filter 9 removes any unwanted DC component in signal a, therewith obtaining signal b shown in FIG. 3b. The amplitude of signal 3b averagely varies around zero level. As such unwanted DC components mainly occur in an analog implementation of the receiver, due to tolerances in the value of the various analog circuit elements, the DC blocking filter 9 can be eliminated in a digital implementation of the FM detector 3.

Figure 3C:
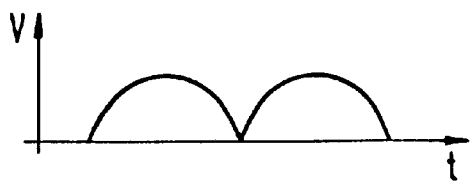
Figure 3D:
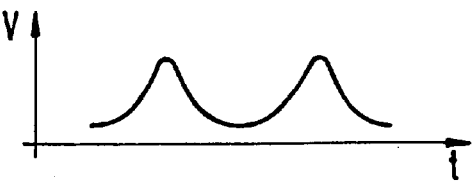

Signal 3b is rectified in the rectifier 10, resulting in a dual phase rectified signal 3c shown in FIG. 3c representing the absolute value or magnitude of the frequency deviation of the momentary IF signal from the IF carrier frequency. Signal 3c is amplified with non-linear gain in the non-linear amplifier 11, resulting in a time constant control signal d—shown in FIG. 3d—, which is supplied to the time constant control terminal 7' of the variable lowpass filter 7 to vary the time constant thereof. The non-linear amplification of the signal 3c is to level the time constant control signal d for excursions of the momentary frequency of the IF signal within the passband of the selective IF amplifier and to accentuate the amplitude variations of this time constant control signal d corresponding to excursions of the momentary frequency of the IF signal across the slope areas of the Selective IF amplifier, where muting of FM signals with low modulation frequencies gives rise to signal distortions and should be avoided.

Figure 3E:
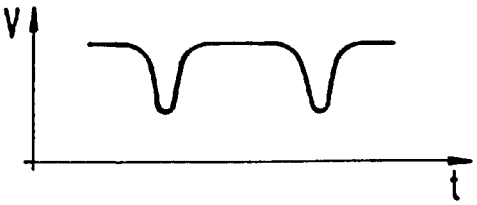
Figure 3F:
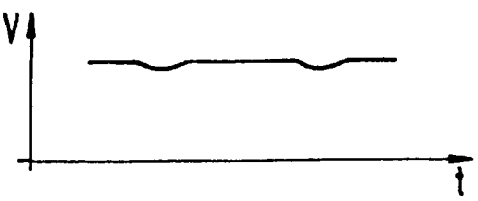

Under control of the time constant control signal d an output signal e of the IF level detector as shown in FIG. 3e is filtered in the variable lowpass filter 7 with a time constant varying in accordance with signal d. The signal curves e and d show, that at any decrease in the IF signal level resulting from filterside suppression in the IF amplifier 2 and giving rise to an amplitude drop in signal e, the time constant of the variable lowpass filter is increased. This results in the mute response being delayed, thereby disabling the muting circuit 4 to respond to such IF signal level decreases. The baseband FM modulation signal and the audiosignal derived therefrom is therewith prevented from being distorted, even at low modulation frequencies of the IF signal.

The time constant is relatively small for deviations of the momentary frequencies within the passband of the selective IF amplifier 2, therewith keeping the mute response alert for suppressing FM demodulation noise. The overall mute response achieved with the variable lowpass filter 7 is reflected in signal f showing an appropriate lack of mute response in situations, where the IF signal level decreases are caused by IF filter side suppression.

It should be noted that the invention is not limited to the embodiment shown in FIG. 1. As mentioned before, the invention may well be used without the DC blocking filter 9, but also without the non-linear amplifier 11 and/or the demultiplexer 5.

It will be apparent to those skilled in the art that various modifications and variations can be made in the method and system of the present invention without departing from the spirit or scope of the invention. Thus, the present invention is not limited by the foregoing descriptions but is intended to cover all modifications and variations that come within the scope of the spirit of the invention and the claims that follow.

What is claimed is:

1. A method for noise reduction during FM reception comprising:

attenuating a detected FM audiosignal having a momentary frequency and FM carrier frequency;

deriving a field strength indicative muting control signal from an IF signal;

controlling an attenuation of the audiosignal using the muting control signal, when the field strength decreases below a certain threshold level, wherein the mute control signal has a time constant which is increased with an increasing deviation of the momentary frequency of the received FM signal from the FM carrier frequency; and detecting a baseband FM modulation signal, wherein the time constant in the mute control signal is controlled with a time constant control signal derived from rectifying the detected baseband FM modulation signal.

2. The method according to claim 1, wherein the derivation of the time constant control signal from the audio signal is non-linearly amplified.

3. A receiver for noise reduction during FM reception comprising:

an RF front end coupled to a selective IF amplifier;

an FM detector which detects a baseband FM modulation signal having an audio signal;

a muting circuit which attenuates the audio signal, the muting circuit having a mute control terminal which supplies the mute control signal, the IF amplifier being coupled through an IF level detector and a lowpass filter to the mute control terminal of the muting circuit; and a baseband FM modulation signal level detector being coupled between an output of the FM detector and a time constant control terminal of the lowpass filter which varies the time constant of the lowpass filter depending on the level of the baseband FM modulation signal.

4. The receiver according to claim 3, wherein the baseband FM modulation signal level detector comprises a rectifier including lowpass filter functionality.

5. The receiver according to claim 3, wherein the baseband FM modulation signal level detector comprises a non-linear amplifier coupled to the rectifier circuit and included between the output of the FM detector and the time constant control terminal of the muting circuit.

6. A receiver according to claim 4 wherein the FM modulation signal level detector comprises a DC blocking filter coupled to said output of the FM detector.

7. A method for noise reduction during FM reception comprising:

attenuating a detected FM audiosignal having a momentary frequency and FM carrier frequency;

deriving a field strength indicative muting control signal from an IF signal;

controlling an attenuation of the audiosignal using the muting control signal, when the field strength decreases below a certain threshold level, wherein the mute control signal has a time constant which is increased with an increasing deviation of the momentary frequency of the received FM signal from the FM carrier frequency; and detecting a baseband FM modulation signal, wherein the time constant in the mute control signal is controlled with a time constant control signal derived from rectifying the detected baseband FM modulation signal.

8. A method for noise reduction during FM reception comprising:

attenuating a detected FM audiosignal having a momentary frequency and FM carrier frequency;

deriving a field strength indicative muting control signal from an IF signal; controlling an attenuation of the audiosignal using the muting control signal, when the field strength decreases below a certain threshold level, wherein the mute control signal has a time constant which is increased with an increasing deviation of the momentary frequency of the received FM signal from the FM carrier frequency; and wherein the derivation of the time constant control signal from the audio signal is non-linearly amplified.

* * * * *